United States Patent
Mori et al.

(10) Patent No.: US 9,655,246 B2
(45) Date of Patent: May 16, 2017

(54) ELECTRONIC COMPONENT WITH REDUCED ELECTROSTRICTIVE VIBRATION

(71) Applicant: TDK CORPORATION, Tokyo (JP)

(72) Inventors: Masahiro Mori, Tokyo (JP); Atsushi Sato, Tokyo (JP); Tomoyoshi Fujimura, Tokyo (JP)

(73) Assignee: TDK CORPORATION, Tokyo (JP)

(*) Notice: Subject to any disclaimer, the term of this patent is extended or adjusted under 35 U.S.C. 154(b) by 0 days.

(21) Appl. No.: 15/007,617

(22) Filed: Jan. 27, 2016

(65) Prior Publication Data
US 2016/0227651 A1 Aug. 4, 2016

(30) Foreign Application Priority Data

Jan. 29, 2015 (JP) .................. 2015-015419

(51) Int. Cl.
| | |
|---|---|
| *H05K 1/18* | (2006.01) |
| *H01G 4/30* | (2006.01) |
| *H01G 4/228* | (2006.01) |
| *H01G 4/012* | (2006.01) |
| *H05K 1/02* | (2006.01) |
| *H05K 1/11* | (2006.01) |
| *H01G 4/224* | (2006.01) |
| *H05K 3/34* | (2006.01) |

(52) U.S. Cl.
CPC ............. *H05K 1/181* (2013.01); *H01G 4/012* (2013.01); *H01G 4/224* (2013.01); *H01G 4/228* (2013.01); *H01G 4/30* (2013.01); *H05K 1/0298* (2013.01); *H05K 1/11* (2013.01); *H05K 3/3436* (2013.01); *H05K 2201/10015* (2013.01); *H05K 2201/10378* (2013.01); *H05K 2201/10636* (2013.01)

(58) Field of Classification Search
None
See application file for complete search history.

(56) References Cited

U.S. PATENT DOCUMENTS 3,550,228 A * 12/1970 Asscher ................. H01G 9/008
174/251
4,458,294 A * 7/1984 Womack .............. H01G 4/2325
338/309

(Continued)

FOREIGN PATENT DOCUMENTS

JP H07-111380 A 4/1995

*Primary Examiner* — Jeremy C Norris
*Assistant Examiner* — Muhammed Azam
(74) *Attorney, Agent, or Firm* — Oliff PLC

(57) ABSTRACT

An electronic component includes a multilayer capacitor and an interposer The multilayer capacitor includes an element body and a pair of external electrodes. The interposer includes a substrate, a pair of first electrodes, and is pair of second electrodes. The substrate includes first and second principal faces. The pair of first electrodes are disposed on the first principal face. The pair of second electrodes are disposed on the second principal thee. The element body includes a first portion and a pair of second portions. The first portion is covered by the external electrodes. The pair of second portions are located on both sides or the first portion and separated from the interposer. A width in a second direction of the pair of external electrodes is smaller than a width in the second direction of the element body and larger than a width in the second direction of the second portion.

9 Claims, 11 Drawing Sheets

(56) References Cited

U.S. PATENT DOCUMENTS

| | | | | |
|---|---|---|---|---|
| 4,497,012 A * | 1/1985 | Gottlieb | H01G 2/06 | 29/25.42 |
| 4,590,537 A * | 5/1986 | Sakamoto | H01G 4/35 | 361/306.3 |
| 4,648,006 A * | 3/1987 | Rayburn | H01G 2/065 | 361/309 |
| 4,675,790 A * | 6/1987 | DeMatos | H01G 9/012 | 361/540 |
| 6,331,930 B1 * | 12/2001 | Kuroda | H01G 4/012 | 361/303 |
| 6,444,921 B1 * | 9/2002 | Wang | H01L 23/49827 | 174/254 |
| 6,512,184 B1 * | 1/2003 | Yamada | H01R 4/04 | 174/259 |
| 6,538,896 B2 * | 3/2003 | Kameda | H03H 9/0557 | 174/250 |
| 7,035,080 B1 * | 4/2006 | Devoe | H05K 1/0231 | 361/303 |
| 7,164,573 B1 * | 1/2007 | Prymak | H01G 2/16 | 361/306.1 |
| 7,595,973 B1 * | 9/2009 | Lee | H01G 4/005 | 361/303 |
| 9,024,707 B1 * | 5/2015 | Park | H03H 7/06 | 333/175 |
| 9,236,186 B2 * | 1/2016 | Ahn | H01G 4/30 | |
| 9,281,126 B2 * | 3/2016 | Park | H01G 4/30 | |
| 9,337,410 B2 * | 5/2016 | Itoh | H01L 41/0838 | |
| 9,338,913 B2 * | 5/2016 | Feichtinger | H01C 7/18 | |
| 9,362,054 B2 * | 6/2016 | Park | H01G 4/30 | |
| 9,384,892 B2 * | 7/2016 | Lee | H01G 4/005 | |
| 9,396,879 B2 * | 7/2016 | Ahn | H01G 2/06 | |
| 9,472,343 B2 * | 10/2016 | Ahn | H01G 4/30 | |
| 2002/0027019 A1 * | 3/2002 | Hashimoto | H01L 23/49805 | 174/260 |
| 2003/0030994 A1 * | 2/2003 | Takaya | H01F 5/06 | 361/728 |
| 2007/0076350 A1 * | 4/2007 | Watanabe | H01G 2/065 | 361/520 |
| 2007/0188975 A1 * | 8/2007 | Togashi | H01G 2/065 | 361/306.3 |
| 2008/0100987 A1 * | 5/2008 | Togashi | H01G 4/005 | 361/301.4 |
| 2009/0059469 A1 * | 3/2009 | Lee | H01G 4/012 | 361/306.2 |
| 2009/0139757 A1 * | 6/2009 | Lee | H01G 4/005 | 174/260 |
| 2009/0141421 A1 * | 6/2009 | Togashi | H01G 4/232 | 361/302 |
| 2009/0168298 A1 * | 7/2009 | Togashi | H01G 4/012 | 361/306.3 |
| 2009/0169839 A1 * | 7/2009 | Sugimoto | B32B 18/00 | 428/201 |
| 2010/0149769 A1 * | 6/2010 | Lee | H01G 2/065 | 361/768 |
| 2010/0157507 A1 * | 6/2010 | Matsumoto | H01G 4/30 | 361/306.3 |
| 2010/0182732 A1 * | 7/2010 | Togashi | H01G 2/065 | 361/303 |
| 2010/0188798 A1 * | 7/2010 | Togashi | H01G 2/06 | 361/306.3 |
| 2011/0024175 A1 * | 2/2011 | Satou | H01G 2/065 | 174/260 |
| 2011/0047794 A1 * | 3/2011 | Togashi | H01G 2/065 | 29/832 |
| 2011/0156203 A1 * | 6/2011 | Park | H01C 1/014 | 257/528 |
| 2012/0050939 A1 * | 3/2012 | Si | H01G 4/012 | 361/303 |
| 2012/0134067 A1 * | 5/2012 | Si | H01G 4/012 | 361/321.2 |
| 2012/0194965 A1 * | 8/2012 | Kuroda | H01G 4/005 | 361/303 |
| 2012/0305302 A1 * | 12/2012 | Mizokami | H01C 1/01 | 174/259 |
| 2013/0020905 A1 * | 1/2013 | Sawada | H01G 4/30 | 310/311 |
| 2013/0175074 A1 * | 7/2013 | Kawai | H01G 2/06 | 174/258 |
| 2013/0193810 A1 * | 8/2013 | Ozawa | H01L 41/0471 | 310/366 |
| 2013/0329388 A1 * | 12/2013 | Dogauchi | H05K 1/0216 | 361/767 |
| 2013/0329389 A1 * | 12/2013 | Hattori | H05K 1/0216 | 361/782 |
| 2014/0041915 A1 * | 2/2014 | Hattori | H05K 1/18 | 174/260 |
| 2014/0151102 A1 * | 6/2014 | Lee | H01G 2/065 | 174/260 |
| 2014/0182910 A1 * | 7/2014 | Ahn | H01G 2/06 | 174/260 |
| 2015/0008024 A1 * | 1/2015 | Park | H01G 4/01 | 174/260 |
| 2015/0022937 A1 * | 1/2015 | Park | H01G 4/30 | 361/270 |
| 2015/0041198 A1 * | 2/2015 | Lee | H01G 2/06 | 174/260 |
| 2015/0041199 A1 * | 2/2015 | Lee | H01G 4/005 | 174/260 |
| 2015/0041202 A1 * | 2/2015 | Ahn | H01G 17/00 | 174/260 |
| 2015/0043185 A1 * | 2/2015 | Ahn | H05K 1/111 | 361/767 |
| 2015/0047890 A1 * | 2/2015 | Lee | H01G 4/30 | 174/260 |
| 2015/0109718 A1 * | 4/2015 | Choi | H01G 2/06 | 361/304 |
| 2015/0114702 A1 * | 4/2015 | Lee | H01G 2/065 | 174/260 |
| 2015/0115893 A1 * | 4/2015 | Lee | H01G 4/30 | 320/135 |
| 2015/0116891 A1 * | 4/2015 | Park | H01G 4/40 | 361/270 |
| 2015/0116892 A1 * | 4/2015 | Park | H01G 4/40 | 361/275.3 |
| 2015/0131194 A1 * | 5/2015 | Park | H01G 4/40 | 361/275.3 |
| 2015/0131195 A1 * | 5/2015 | Park | H01G 2/14 | 361/275.3 |
| 2015/0131196 A1 * | 5/2015 | Park | H01G 4/40 | 361/275.3 |
| 2015/0131252 A1 * | 5/2015 | Park | H05K 1/181 | 361/782 |
| 2015/0131253 A1 * | 5/2015 | Park | H01G 2/06 | 361/782 |
| 2015/0170841 A1 * | 6/2015 | Ahn | H01G 4/30 | 174/260 |
| 2015/0213960 A1 * | 7/2015 | Moon | H01G 4/40 | 361/270 |
| 2015/0243438 A1 * | 8/2015 | Ahn | H01G 4/012 | 174/258 |
| 2015/0270065 A1 * | 9/2015 | Hattori | H01G 2/065 | 174/255 |
| 2015/0325370 A1 * | 11/2015 | Lee | H01G 4/008 | 361/275.3 |
| 2015/0325378 A1 * | 11/2015 | Park | H03H 7/0115 | 333/185 |
| 2015/0332852 A1 * | 11/2015 | Kim | H05K 1/181 | 174/260 |
| 2016/0007446 A1 * | 1/2016 | Ishikawa | H05K 1/113 | 174/260 |
| 2016/0118192 A1 * | 4/2016 | Fujimura | H01G 4/30 | 174/260 |
| 2016/0227651 A1 * | 8/2016 | Mori | H05K 1/181 | |

* cited by examiner

Fig.1
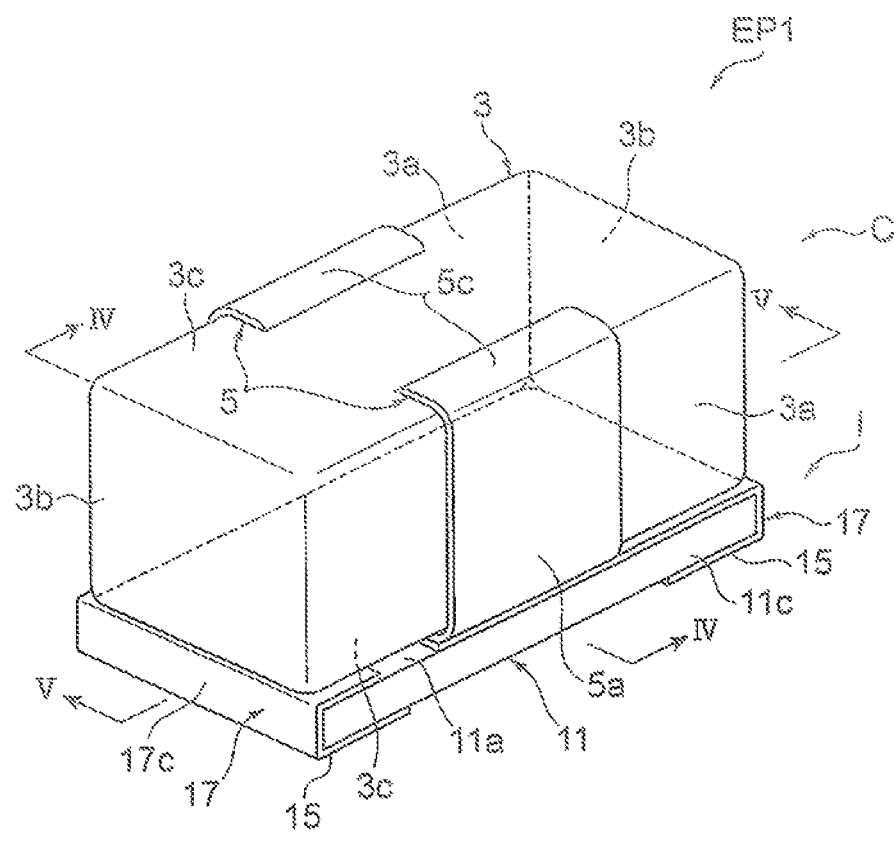
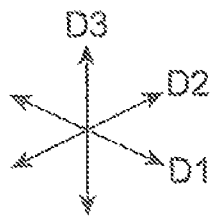

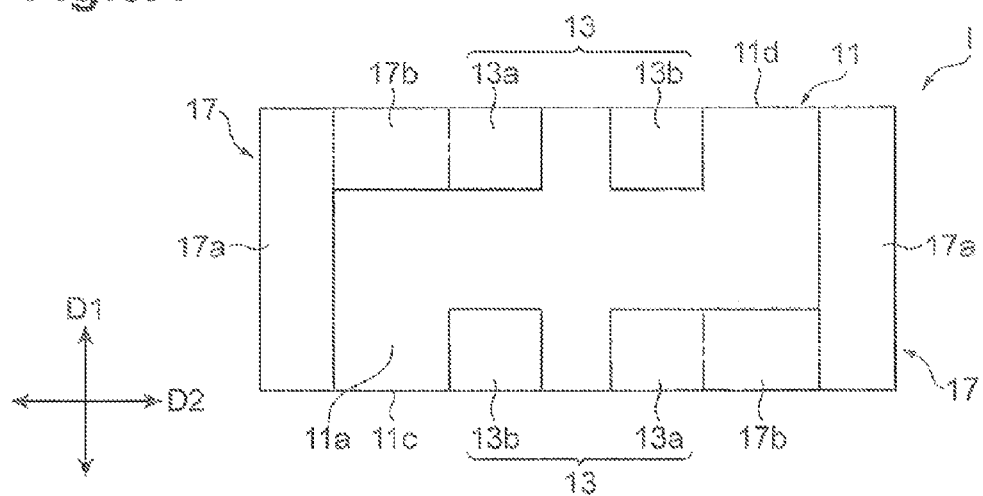
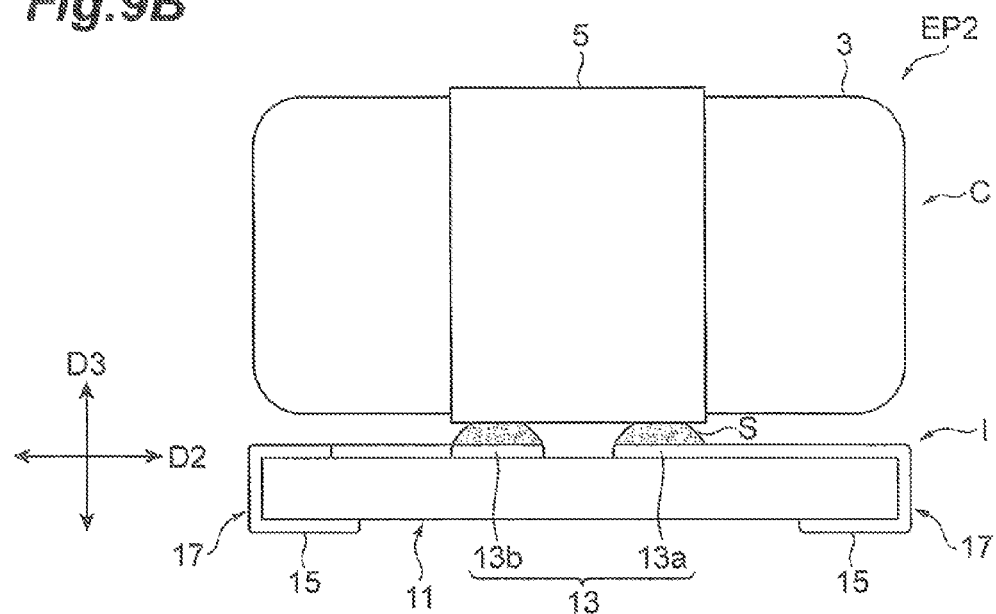

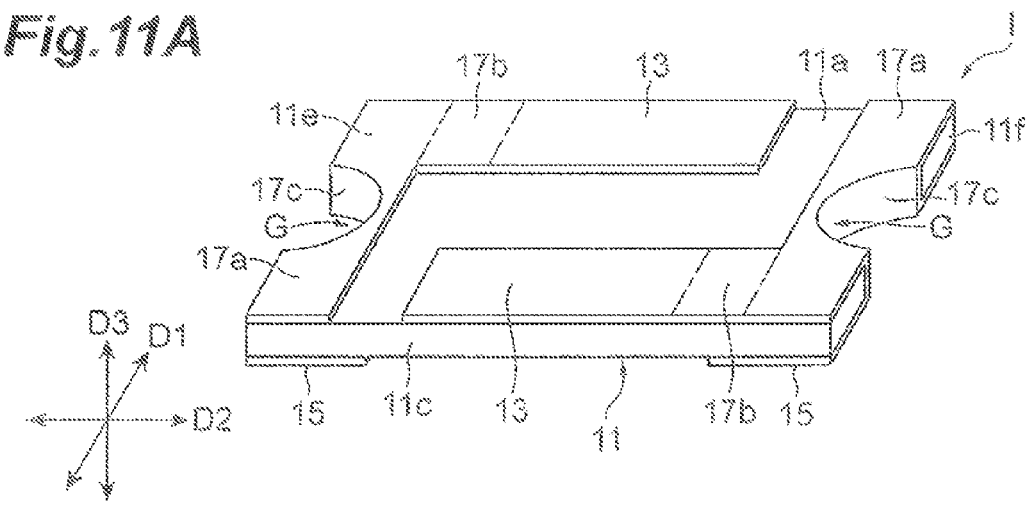
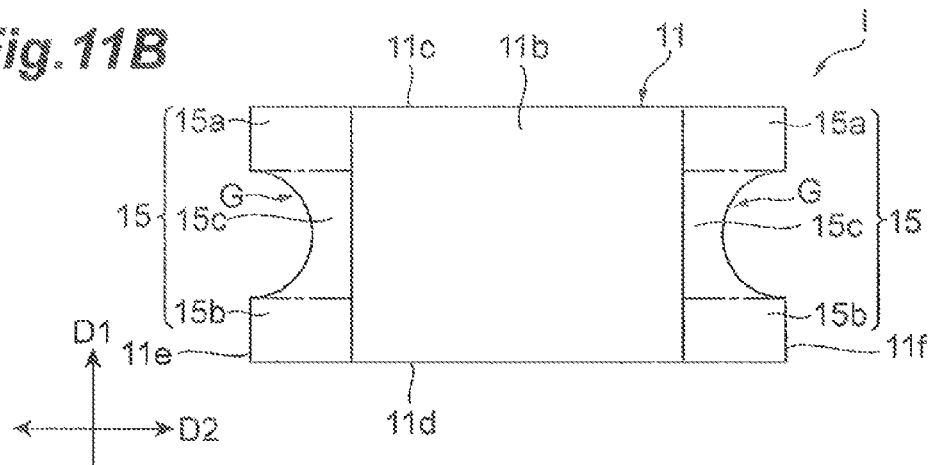
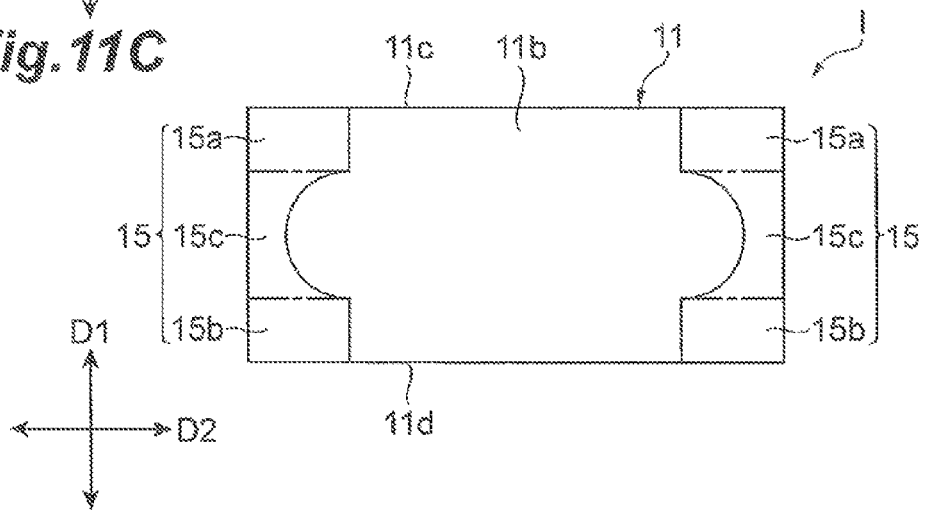

ELECTRONIC COMPONENT WITH REDUCED ELECTROSTRICTIVE VIBRATION

TECHNICAL FIELD

An aspect of the present invention relates to all electronic component having a multilayer capacitor and an interposer on which the multilayer capacitor is mounted.

BACKGROUND

Known electronic components include, a multilayer capacitor and an interposer on which the multilayer capacitor is mounted (e.g., cf. Japanese Unexamined Patent Publication No. H07-111380).

When a voltage is applied to the multilayer capacitor, an element body thereof is subject to mechanical strain in the magnimde in accordance with the applied voltage due to the electrostrictive effect. This mechanical strain induces vibration in the multilayer capacitor (which will be referred to hereinafter as 'electrostrictive vibration'). When the voltage is applied to the multilayer capacitor mounted on an electronic device (e.g., a circuit board or another electronic component), the electrostrictive vibration propagates to the electronic device. The propagation of the electrostrictive vibration to the electronic device may lead to vibration of, the electronic device, so as to cause acoustic noise.

In the aforementioned electronic component, the multilayer capacitor is mounted on the interposer. When the electronic component is mounted on the electronic device, the multilayer capacitor is connected via the interposer to the electronic device. For this reason, the electrostrictive vibration is less likely to propagate to the electronic device, and thus occurrence of the acoustic noise is suppressed.

SUMMARY

In the foregoing electronic component, the muitilayer capacitor is mounted in such a manner that the element body of the multilayer capacitor is in contact with the interposer. When the element body of the multilayer capacitor is in contact with the interposer, the electrostrictive vibration induced in the multilayer capacitor propagates directly from the element body to the interposer. The vibration having propagated to the interposer may further propagate from the interposer to the electronic device to cause vibration of the electronic, device.

Therefore, in the case of the foregoing electronic component, it is difficult to fully suppress the occurrence of acoustic noise.

An object of one aspect of the present invention is to provide an electronic component capable of fully suppressing the occurrence of acoustic noise.

An electronic component according to one aspect of the present invention includes a multilayer capacitor, and an interposer on which the multilayer capacitor is mounted. The multilayer capacitor includes a multilayer body of a substantially rectangular parallelepiped shape, and a pair of external electrodes disposed on ends in a first direction in the multilayer body. In the multilayer body, a plurality of dielectric layers and a plurality of internal electrodes are stacked. The pair of external electrodes are connected to corresponding internal electrodes out of the plurality of internal electrodes. The interposer includes a substrate, a pair of first electrodes, a pair of second electrodes, and a pair of connection electrodes. The substrate includes a first principal face opposed to the multilayer capacitor, a second principal face opposed to the first principal face, first and second side faces opposed to each other in the first direction, and third and fourth side faces of a planar shape opposed to each other in a second direction perpendicular to bath the first direction and a direction in which the first and second principal faces are opposed. The first and second principal faces, the first and second side faces, and the third and fourth side faces are planar. The pair of first electrodes are disposed on the first and second side face sides of the first principal face and each connected to a corresponding external electrode of the pair of external electrodes. The pair of second electrodes are disposed on the third and fourth side face sides of the second principal face. The pair of connection electrodes are disposed on the first principal face and each electrically connected to the first electrode and to the second electrode. The multilayer body, when viewed, from the first direction, includes a first portion covered by the external electrode, and a pair of second portions located on both sides of the first portion and exposed from the external electrode. The pair of second portions of the multilayer body are separated from the interposer. A width in the second direction of the pair of external electrodes is smaller than a width in the second direction of the multilayer body and larger than a width in the second direction of the second portion.

In the electronic component according to the foregoing one aspect, the pair of second portions are separated from the interposer. For this reason, the electrostrictive vibration induced in the multilayer capacitor is prevented from propagating directly from each of the second portions of the multilayer body to the interposer.

The external electrodes of the multilayer capacitor are connected to the first electrodes of the interposer. The width in the second direction of the pair of external electrodes is smaller than the width in the second direction of the multilayer body. For this reason, the electrostrictive vibration induced in the first portion being a part of the multilayer body propagates mainly through the external electrodes to the substrate of the interposer. The width in the second direction of the pair of external electrodes larger than the width in the second direction of the second portion. For this reason, a posture of the multilayer capacitor (multilayer body) becomes stabilized on the interposer. This makes it feasible to stably maintain a state in which the pair of second portions are separated from the interposer. Therefore, the vibration propagating from the multilayer body to the substrate of the interposer becomes little as a result.

As a consequence of the foregoing, the vibration propagating from the multilayer capacitor through the interposer to an electronic device is reduced in the electronic component according to the above one aspect, so that the occurrence of acoustic noise can be fully suppressed. The pair of connection electrodes are not disposed on the second principal face but disposed on the first principal face. For this reason, in a process of mounting the electronic component with solder, the solder is less likely to flow from the pair of second electrodes onto the pair of connection electrodes so as to cause unevenness of solder amounts between the pair of second electrodes. Therefore, it is feasible to prevent inclination of the electronic component in the mounting process.

The pair of connection electrodes may include a pair of first electrode portions disposed on the third and fourth side face sides of the first principal face and extending in the first direction, and a width in the first direction of each of the first electrodes may be smaller than a width in the first direction of each of the first electrode portions and larger than a width in the second direction of each of the first electrode portions. In this case, the area of each of the first electrode portions on the first principal face is smaller than the area in a case where the width in the second direction of each of the first electrode portions is equivalent to the width in the first direction of each of the first electrodes. For this reason, in a process of mounting the electronic component on an electronic device with solder, the solder is prevented from flowing up onto the first principal face side of the substrate. This can prevent the multilayer body of the multilayer capacitor from being directly connected through the solder to the substrate of the interposer.

Each of the pair of first electrodes may include two electrode portions separated from each other in the second direction. In this case, in a process of mounting the multilayer capacitor on the interposer with solder, each of the external electrodes of the multilayer capacitor is connected to the solder provided on each of the two electrode portions separated from each other. In this way the number of connection points by the solder increases. Since this stabilizes the posture of the multilayer capacitor on the interposer, the multilayer capacitor is less likely to be mounted in an inclined state. Therefore, the second portions of the multilayer body are prevented from coming into contact with the interposer, whereby the occurrence of acoustic sound is surely suppressed.

Each of the connection electrodes ma be coupled to the first electrode, and a solder resist may be provided on each of the connection electrodes and in the vicinity of the first electrode. In this case, the solder on the first electrodes is prevented from flowing onto the connection electrodes. For this reason, unevenness of solder amounts is unlikely to occur between the pair of first electrodes. Since this stabilizes the posture of the multilayer capacitor on the interposer, the multilayer capacitor is less likely to be mounted in the inclined state.

The pair of first electrodes may overlap each other when viewed from the first direction, and a distance in the second direction between an end of the first electrode, disposed on the first side face side, on the third side face side and an end of the first electrode, disposed on the second side face side, on the fourth side face side may be equivalent to the width in the second direction of the pair of external electrodes. in this case, in the process of mounting the multilayer capacitor on the interposer with solder, the solder on the first electrodes can melt and spread only to the ends thereof. For this reason, it is easy to match the end of the first electrode, disposed on the first side thee side, on the third side face side and the end of the external electrode, connected thereto, on the third side face side. It is easy to match the end of the first electrode, disposed on the second side face side, on the fourth side face side and the end of the external electrode, connected thereto, on the fourth side face side. Therefore, the multilayer capacitor becomes less likely to be mounted with deviation in the second direction with respect to the interposer.

The pair of external electrodes may include a pair of electrode portions disposed on a face opposed to the first principal face in the muitilayer body, and a width in the first direction of the first electrode may be larger than a width in the lint direction of the pair of electrode portions disposed on the face opposed to the first principal face in the multilayer body. In this case, in the process of mounting the multilayer capacitor on the interposer with solder, the solder melts and spreads on the pair of first electrodes, so as to enhance fixing strength between the pair of first, electrodes and the pair of external electrodes. As a result, the multilayer capacitor is firmly mounted on the interposer.

The pair of external electrodes may include a pair of electrode portions disposed on a pair of faces opposed in the first direction in the multilayer body, and the electrode portion disposed on each of the faces opposed in the first direction in the multilayer body may be connected to the first electrode with solder. In this case, since the solder is easier to melt and spread in a wide range, the multilayer capacitor is firmly mounted on the interposer.

Each of the third and fourth side faces may be provided with a groove continuous from the first principal face to the second principal face in a center in the first direction. In this case, each of the second electrodes is divided in the first direction by the groove and includes two electrode portions separated from each other. Therefore, in the process of mounting the electronic component on the electronic device with, solder, each of the second electrodes is connected to the electronic device by the solder provided on each of the two electrode portions separated from each other. In this way the number of connection points increases. Since this stabilizes a posture of the electronic component on the electronic device, the electronic component is less likely to be mounted in an inclined state.

Each of the pair of second electrodes may include two electrode portions separated from each other in the first direction. in this case, in the process of mounting the electronic component on the electronic device with solder, each of the second electrodes is connected to the electronic device by the solder provided on each of the two electrode. portions separated from each other. In this way the number of connection points increases. Since this stabilizes the posture of the electronic component on the electronic device, the electronic component is less likely to be mounted in the inclined state.

BRIEF OF THE DRAWINGS

FIG. 1 is a perspective view showing an electronic component according to an embodiment.

FIGS. 9A and 9B are drawings for explaining an electronic component according to Modification Example 1.

FIGS. 11A to 11C are drawings for explaining electronic components according to Modification Examples 5 and 6.

DETAILED DESCRIPTION

An embodiment according to one aspect of the present invention will be described below in detail with reference to the accompanying drawings. It is noted that in the description the same elements or elements with the same functionality will be denoted by the same reference signs, without redundant description.

Figure 2:
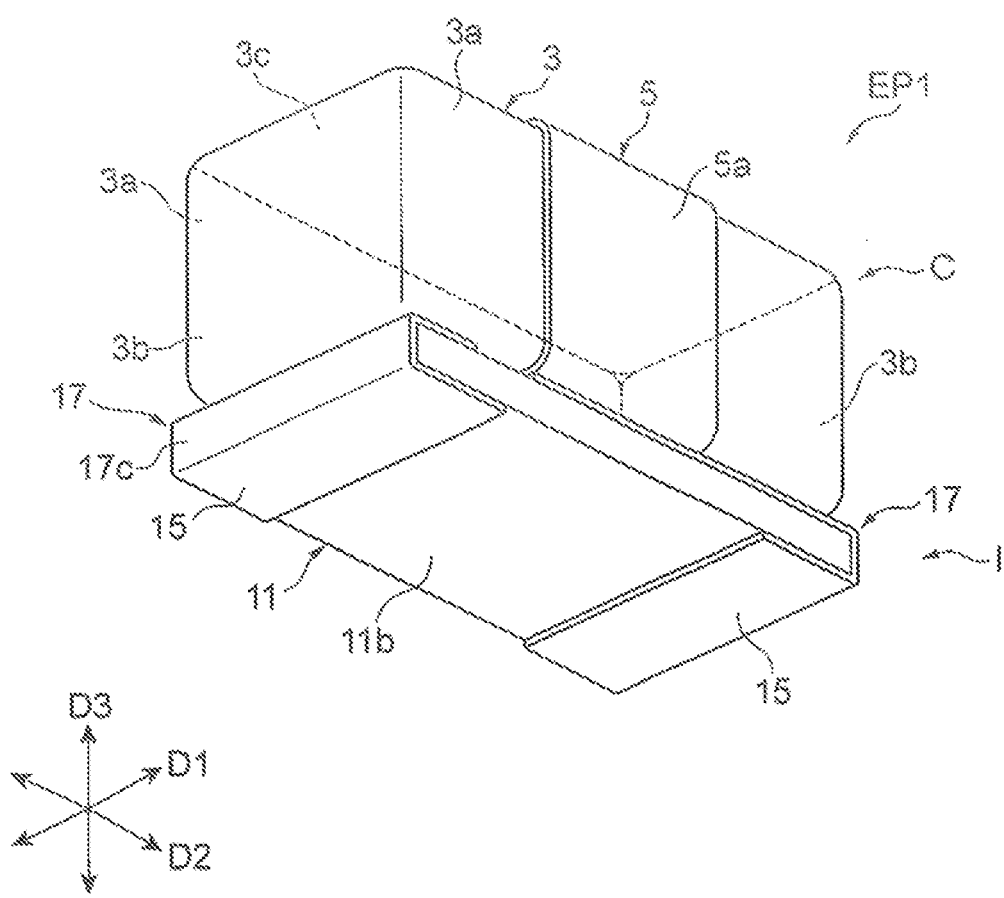
FIG. 2 is a perspective view showing the electronic component according to the embodiment.
Figure 3:
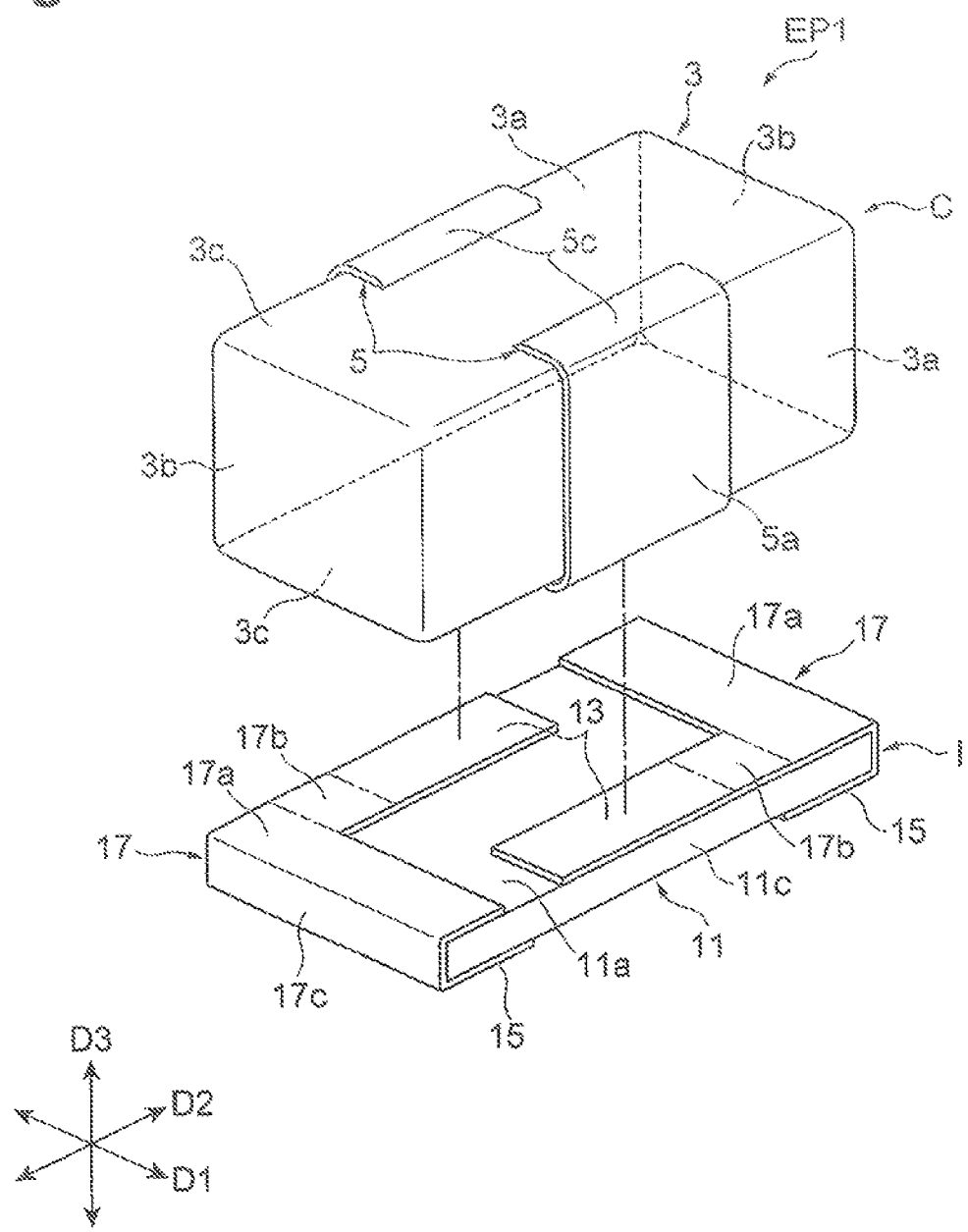
FIG. 3 is an exploded perspective view showing the electronic component according to the embodiment.
Figure 4:
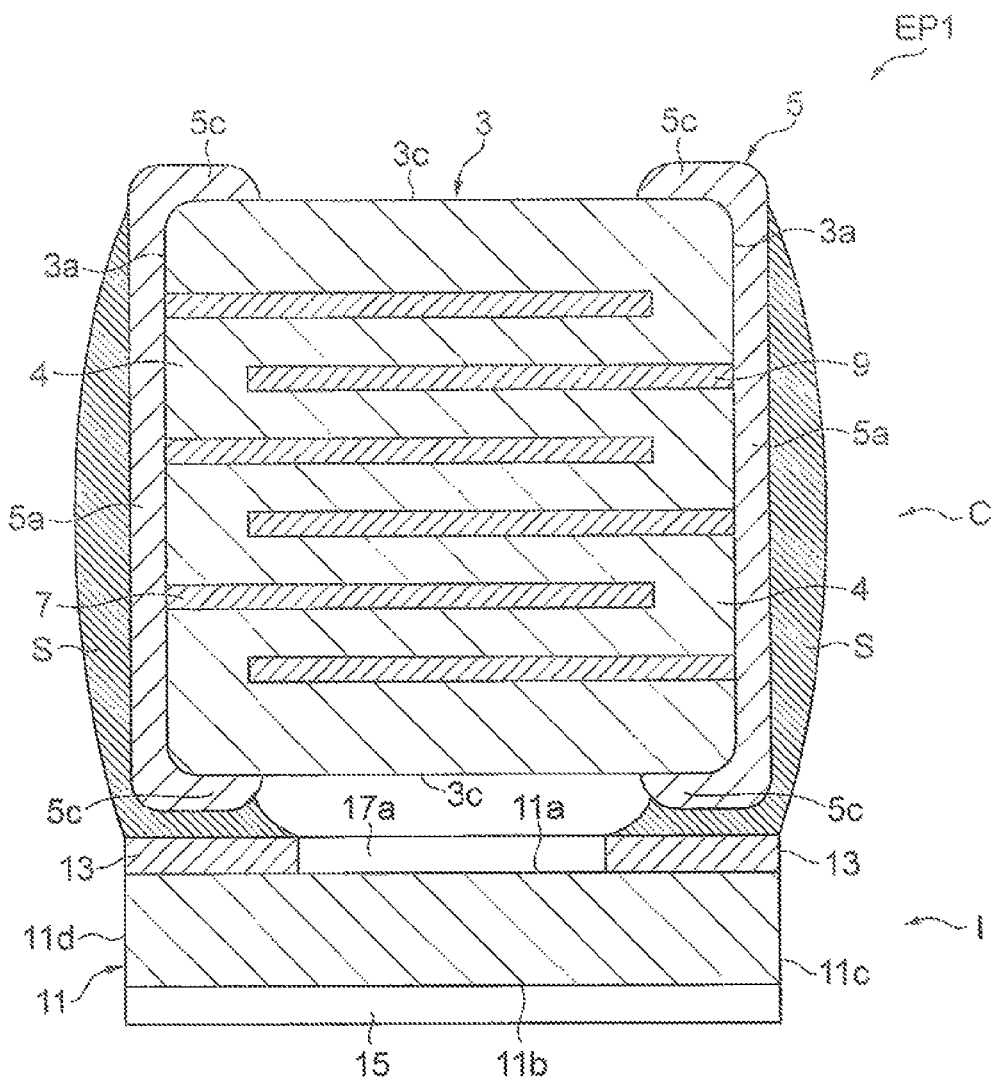
FIG. 4 is a drawing for explaining a cross-sectional configuration along the line IV-IV in FIG. 1.
Figure 5:
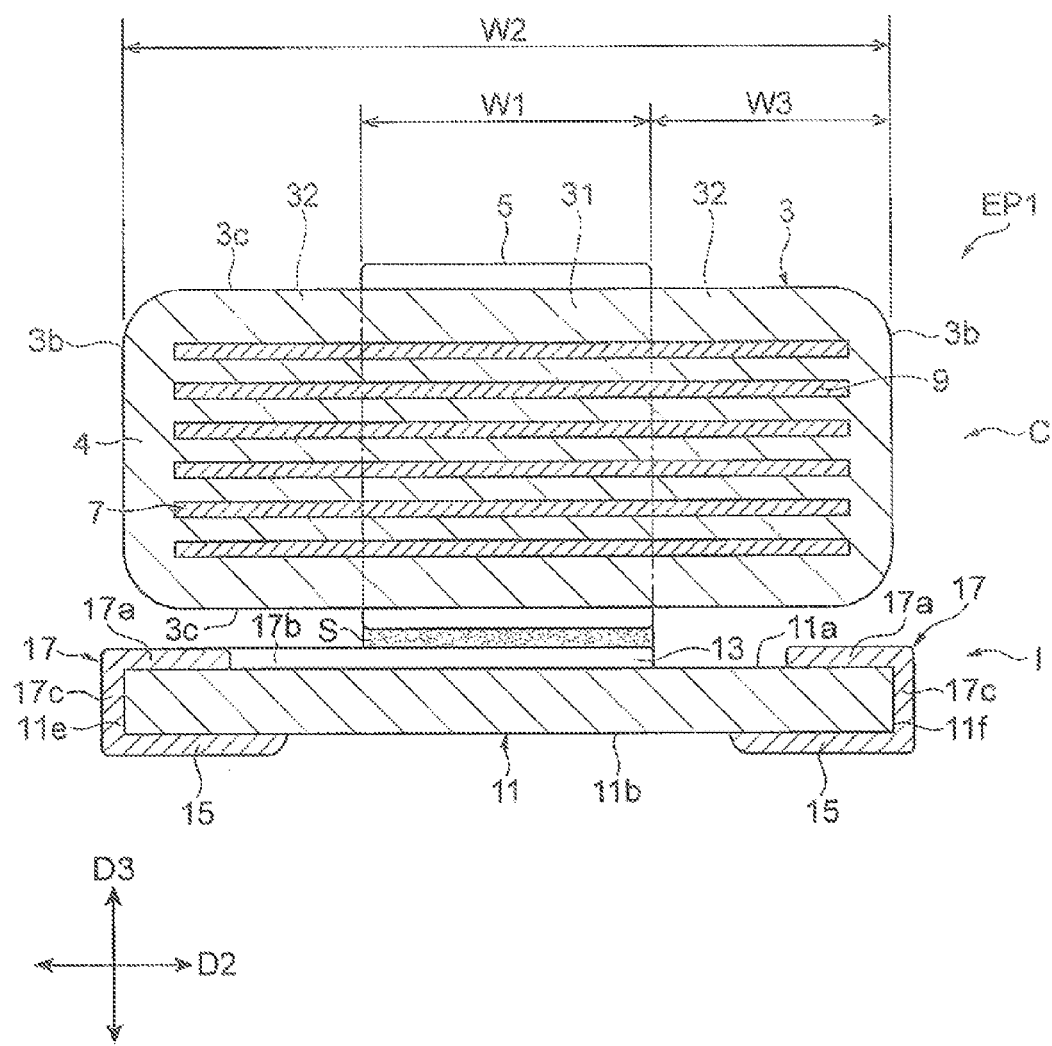
FIG. 5 is a drawing for explaining a cross-sectional configuration along the line V-V in FIG. 1.
Figure 6A:
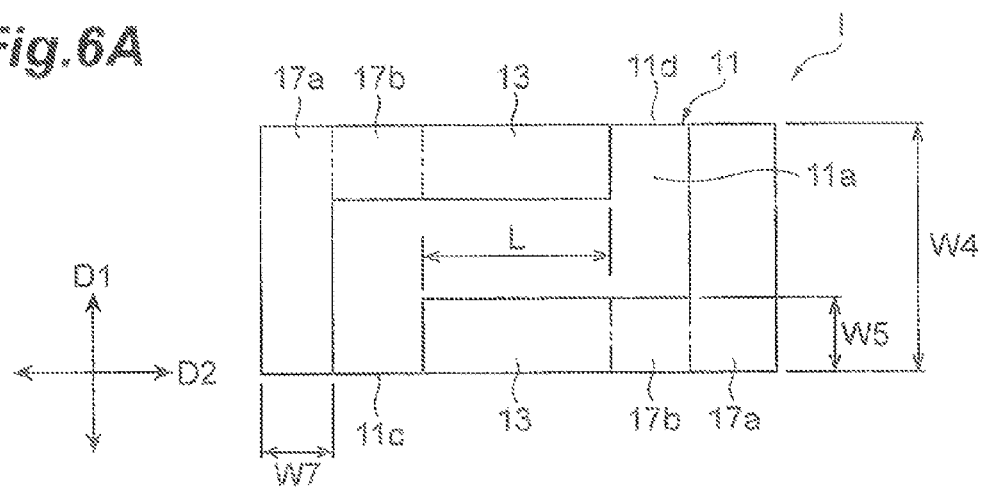
FIG. 6A is a top plan view showing an interposer in FIG. 1, FIG. 6B a bottom plan view showing the interposer in FIG. 1, and FIG. 6C a bottom plan view showing a multilayer capacitor in FIG. 1.
Figure 6B:
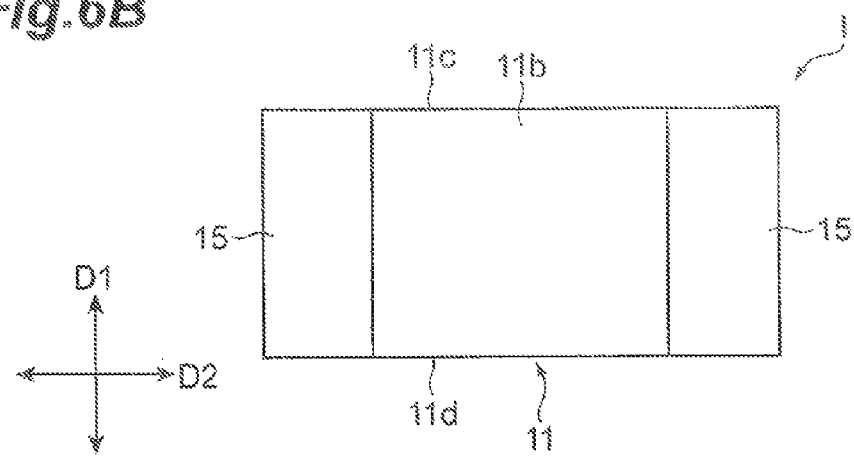
Figure 6C:
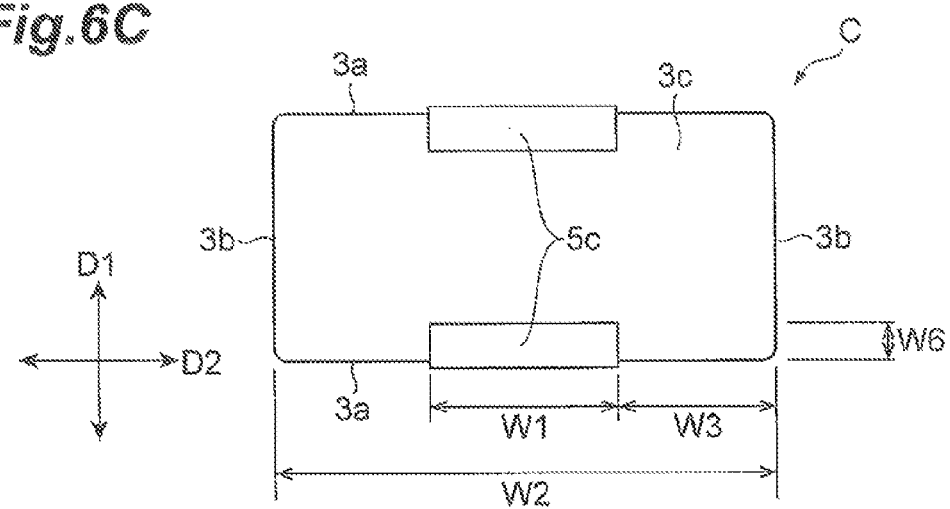

The configuration of the electronic component EP1 according to the embodiment will be described with reference to FIGS. 1 to 5 and FIGS. 6A to 6C, FIGS. 1 and 2 are perspective views showing the electronic component of the embodiment. FIG. 3 is an exploded perspective view showing the electronic component of the embodiment. FIG. 4 is a drawing for explaining the cross-sectional configuration along the line IV-IV in FIG. 1. FIG. 5 is a drawing for explaining the cross-sectional configuration along the line V-V in FIG. 1. FIG. 6A is a top plan view showing the interposer in FIG. 1, FIG. 6B a bottom plan view showing the interposer in FIG. 1, and FIG. 6C a bottom plan view showing the multilayer capacitor in FIG. 1.

As shown in FIGS. 1 to 5, the electronic component EP1 includes the multilayer capacitor C and the interposer I. The multilayer capacitor C is mounted on the interposer I. In the present embodiment, the multilayer capacitor C and the interposer I are connected by solder S. Namely, the multilayer capacitor C is mounted on the interposer I with solder. The multilayer capacitor C and the interposer I may be connected to each other with an electroconductive resin. FIGS. 1 to 3 are depicted without illustration of the solder S.

The multilayer capacitor C includes an element body multilayer body) 3 and a pair of external electrodes 5. The pair of external electrodes 5 are disposed on the exterior surface of the element body 3.

The element body 3 is of a substantially rectangular parallelepiped shape. The element body 3 includes, as its exterior surface, a pair of first side faces 3a, a pair of second side faces 3b, and a pair of third side faces 3c. The pair of first side faces 3a are opposed to each other in a first direction D1. The pair of second side faces 3b are opposed to each other in a second direction D2. The second direction D2 is perpendicular to the first direction D1. The pair of third side faces 3c are opposed to each other in a third direction D3, The third direction D3 is perpendicular to the first direction D1 and the second direction D2. Each of the second side faces 3b is of a substantially square shape. Each of the first side faces 3a and the third side faces 3c is of a substantially rectangular shape. The longitudinal direction of the element body 3 is the direction in which the pair of second side faces 3b are opposed, i.e., the second direction D2.

The pair of first side faces 3a extend in the third direction D3 to connect the pair of third side faces 3c. The pair of first side faces 3a also extend in the second direction D2 to connect the pair of second side faces 3b. The pair of second side faces 3b extend in the third direction D3 to connect the pair of third side faces 3c. The pair of second side faces 3b also extend in the first direction D1 to connect the pair first side faces 3a. The pair of third side faces 3c extend in the first direction D1 to connect the pair of first side faces 3a. The pair of third side faces 3c also extend in the second direction D2 to connect the pair of second side faces 3b.

A pair of external electrodes 5 are disposed on ends in the first direction D1 of the element body 3. Each of the pair of external electrodes 5 includes an electrode portion 5a and a pair of electrode portions 5c. The pair of electrode portions 5a are disposed on the pair of first side faces 3a, respectively. The pair of electrode portions 5c are disposed on the pair of third side faces 3c, respectively. Each electrode portion 5a is disposed to cover a central region in the longitudinal direction (second direction D2) of the first side face 3a. Each electrode portion 5c is disposed on a central portion in the longitudinal direction (second direction D2) and on the end of the third side face 3c on the first side face 3a side.

The electrode portion 5a disposed on one of the first side faces 3a is coupled to the pair of electrode portions 5c disposed on the ends of the pair of third side faces 3c on the one of the first side face 3a side to be integrated, therewith. The electrode portion 5a disposed on the other of the first side faces 3a is coupled to the pair of electrode portions 5c disposed on the ends of the pair of third side laces 3c on the other of the first side face 3a side to be integrated therewith. The pair of external electrodes 5 overlap each other when viewed from the first direction D1. The pair of external electrodes 5 have a constant width in the second direction D2.

Each external electrode 5 is formed, for example, by delivering an electroconductive paste containing electroconductive metal powder and glass frit, onto the exterior surface of the element body 3 and sintering it. In certain cases, a plated layer is formed, if necessary, on each external electrode 5 thus sintered. The external electrodes 5 are electrically isolated from each other on the exterior surface of the element body 3.

As shown in FIGS. 4 and 5, the element body 3 is configured of a plurality of dielectric layers 4 stacked in the third direction 3. In the element body 3, a direction in which the plurality of dielectric layers 4 are stacked (hereinafter simply referred to as 'stack direction') is coincident with the third direction D3. Each dielectric layer 4 includes, for example, a sintered body of a ceramic green sheet containing a dielectric material. (e.g., a $BaTiO_3$-based, $Zr)O_3$-based, or $(Ba, Ca)TiO_3$-based dielectric ceramic). In the element body 3 in practice, the dielectric layers 4 are so integrated that no boundary can be visually recognized between the dielectric layers 4.

The element body 3 includes a plurality of internal electrodes 7 and a plurality of internal electrodes 9. The element body 3 is configured as a multilayer body in which the plurality of dielectric layers 4 and the plurality of internal electrodes 7 and 9 are stacked. Each internal electrode 7 or 9 is of a substantially rectangular shape, for example, on a plan view from the third direction D3. Each internal electrode 7 or 9 is made of an electroconductive material commonly used as internal electrodes of multilayer electric devices (e.g., Ni or Cu). Each internal electrode 7 or 9 is configured as a sintered body of an electroconductive paste containing the foregoing electroconductive material.

The internal electrodes 7 and the internal electrodes 9 are disposed at different positions (layers) in the third direction D3. Namely, the internal electrodes 7 and the internal electrodes 9 are alternately disposed to be opposed with a space in between in the third direction D3. Each internal electrode 7 is exposed at its one end in one of the first side faces 3a. The one end of each internal electrode 7 exposed at the one of the first side faces 3a is electrically connected to one of the external electrodes 5. Each internal electrode 9 is exposed at its other end in the other of the first side faces 3a. The other end of each internal electrode 9 exposed at the other of the first side faces 3a is electrically connected to the other of the external electrodes 5. Namely, the pair of external electrodes 5 are connected to the corresponding internal electrodes out of the plurality of internal electrodes 7, 9. The polarity of each internal electrode 7 is different from that of each internal electrode 9.

As shown in FIG. 5, the element body 3 includes a first portion 31 and a pair of second portions 32. The first portion 31 is covered by the external electrode 5 when viewed from the first direction D1. The pair of second portions 32 are located on both sides of the first portion 31 and exposed from the external electrode 5, when viewed from the first direction D1. The pair of second portions 32 are separated from the interposer I in the third direction D3. For this reason, the electrostrictive vibration induced in the multi-layer capacitor C is prevented from propagating directly from each second portion 32 of the element body 3 to the interposer I.

The width W1 in the second direction D2 of the pair of external electrodes 5 is smaller than a width W2 in the second direction D2 of the element body 3. A width in the second direction D2 of the first portion 31 is equal to the width W1 in the second direction D2 of the pair of external electrodes 5. Widths W3 in the second direction D2 of the pair of second portions 32 are equivalent to each other. The width W3 is smaller than the width W1 in the second direction D2 of the pair of external electrodes 5. The sum of the width W1 and twice the width W3 is the width W2. Therefore, the width W1 is larger than one third of the width W2.

As shown in FIGS. 1 to 5 and FIGS. 6A to 6C, the interposer I includes a substrate 11, a pair of first electrodes 13, a pair of second electrodes 15, and a pair of connection electrodes 17. In the present embodiment, each first electrode 13, each second electrode 115, and each connection electrode 17 are made, for example, of Cu The substrate 11 is of a substantially rectangular shape on a plan view from the third direction D1. The substrate 11 includes first and second principal faces 11a, 11b, first and second side faces 11c, 11d, and third and fourth side faces 11e, 11f. The first and second principal. faces 11a, 11b are of a planar shape and are opposed to each other in the third direction D3. The first and second side faces 11c, 11d are of a planar shape and are opposed to each other in the first direction D1. The third and fourth side faces 11e, 11f are of a planar shape and are opposed to each other in the second direction D2. The third direction D3 is a direction in which the first principal face 11a and the second principal face 11b are opposed. The substrate 11 has an electrically insulating property. The substrate 11 is made, for example, of an electrically insulating resin such as glass epoxy resin. The thickness of the substrate 11 is set, for example, in the range of 60 to 300 μm.

The first and second side faces 11c, 11d extend in the third direction 133 to connect the first and second principal faces 11a, 11b. The first and second side faces 11c, 11d also extend in the second direction D2 to connect the third and fourth side faces 11e, 11f. The third and fourth side faces 11e, 11f extend in the third direction D3 to connect the first and second principal faces 11a, 11b. The third and fourth side faces 11e, 11f also extend in the first direction D1 to connect the first and second side faces 11c, 11d.

The first principal face 11a is opposed to the multilayer capacitor C in the third direction D3. The first and second principal faces 11a, 11b are of a rectangular shape with the long sides along the second direction D2 and the short sides along the first direction D1. The substrate 11 is formed in the size approximately equal to or slightly larger than the multilayer capacitor C, when viewed from, the third direction D3.

The pair of first electrodes 13 are connected to the pair of external electrodes 5. In a state in which the multilayer capacitor C is mounted on the interposer I, the pair of first electrodes 13, as viewed from the third direction D3, include portions extending in the first direction D1 and overlapping the pair of external electrodes 5. The pair of first electrodes 13 are disposed on the first side face 11c side and on the second side face 11d side, respectively, of die first principal face 11a, corresponding to the pair of external electrodes 5. Namely, the pair of first electrodes 13 are separated in the first direction D1 on the first principal face 11a. The pair of first electrodes 13 are disposed on a central region in the second direction D2. Each of the pair of first electrodes 13 is of a rectangular shape.

The pair of first electrodes 13 overlap each other when viewed from the fast direction D1. The end of the first electrode 13, disposed on the first side face 11c side, on the third side face 11e side is separated from the connection electrode 17 and the third side face 11e. The end of the first electrode 13, disposed on the second side face 11d side, on the fourth side face 11f side is separated from the connection electrode 17 and the fourth side face 11f. A distance L in the second direction D2 between the end of the first electrode 13, disposed on the first side face 11c side, on the third side face 11e side and the end of the first electrode 13, disposed on the second side face 11d side, on the fourth side face 11f side is equivalent to the width W1 in the second direction D2 of the pair of the external electrodes 5.

One of the external electrodes 5 is connected to one of the first electrodes 13. The other external electrode 5 is connected to the other first electrode 13. Namely, the pair of first electrodes 13 are connected to the respective corresponding external electrodes out of the pair of external electrodes 5. The first electrode 13 disposed on the first side face 11c side and the external electrode 5 connected thereto include their respective ends coincident with each other on the third side face 11e side. The first electrode 13 disposed on the second side face 11d side and the external electrode 5 connected thereto include their respective ends coincident with each other on the fourth side face 11f side.

The end of the first electrode 13, disposed on the first side face 11c side, on the fourth side face 11f side is coincident with the end of the corresponding external electrode 5 on the fourth side face 11f side. The end of the first electrode 13, disposed on the second side face 11d side, on the third side face 11e side is coincident with the end of the corresponding external electrode 5 on the third side face 11e side. In the present embodiment, the two ends in the second direction D2 of the first electrodes 13 are coincident with the two ends in the second direction D2 of the external electrodes 5. Namely, a width in the second direction D2 of each first electrode 13 is equivalent to the width W1 in the second direction D2 of the external electrode 5. A width W5 in the first direction D1 of the first electrode 13 is larger than a width W6 in the first direction D1 of each electrode portion 5c.

The multilayer capacitor C is disposed on the interposer I in such a manner that one of the third side faces 3c is opposed to the first principal face 11a of the interposer I in the third direction D3. Solder S to connect the first electrode 13 and the external electrode 5 melts and flows up onto the electrode portion 5a from the electrode portion 5c opposed to the first electrode 13, so as to connect the electrode portion 5a and the first electrode 13. In this regard, the solder S melts and flows up to the height of not less than half of the multilayer capacitor C. Namely, the electrode portion 5a is covered by the length not less than half in the third direction D3 by the solder S.

The pair of second electrodes 15 are electrically connected to the respective corresponding first electrodes 13 out of the pair of first electrodes 13. The pair of second electrodes 15 are disposed on the third side face 11e side and on the fourth side face 11f side, respectively, of the second principal face 11b. Namely, the pair of second electrodes 15 are separated in the second direction D2 on the second principal face 11b. The pair of second electrodes 15 overlap the pair of second portions 32 of the element body 3 when viewed from the third direction D3. In the present embodiment, each of the pair of second electrodes 15 is of a rectangular shape. The pair of second electrodes 15 are disposed across the entire length of the second principal face 11b in the first direction D1.

The pair of connection electrodes 17 are electrically connected to the first electrodes 13 and the second electrodes 15. Namely, one of the connection electrodes 17 is electrically connected to one of the first electrodes 13 and to one of the second electrodes 15. The other connection electrode 17 is electrically connected to the other first electrode 13 and to the Other second electrode 15. The pair of connection electrodes 17 are disposed on the first principal face 11a and respectively on the third and fourth side faces 11e, 11f. The pair of connection electrodes 17 include a pair of electrode portions 17a-17c. The electrode portions 17a-17c are coupled to each other to be integrated.

The pair of electrode, portions 17a are disposed on the third and fourth side face 11e, 11f sides of the first principal face 11a. The pair of electrode portions 17a extend in the first direction D1. In the present embodiment, each electrode portion 17a is disposed across the entire length of the first principal face 17a in the first direction D1. The electrode portions 17a are of a substantially rectangular shape when viewed from the third direction D3. A width W4 in the first direction D1 of each electrode portion 17a is larger than the width W5 in the first direction D1 of the first electrode 13. A width W7 in the second direction D2 of each electrode portion 17a is equivalent to the width W5 in the first direction D1 of the first electrode 13.

The pair of electrode portions 17b are disposed on the first and second side face 11e, 11d sides of the first principal face 11a. The pair of electrode portions 17b electrically connect the pair of first electrodes 13 to the pair of electrode portions 17a. More specifically, one of the two ends in the second direction D2 of each electrode portion 17b is coupled to one end in the second direction D2 of the first electrode 13, The other of the two ends in the second direction D2 of each electrode portion 17b is coupled to the electrode portion 17a. This makes each first electrode 13 integrated with the connection electrode 17. In the present embodiment, each electrode portion 17b is of a substantially rectangular shape when viewed from the third direction D3. A width in the first direction D1 of each electrode portion 17b is equivalent to the width W5 in the first direction D1 of the first electrode 13.

The pair of electrode portions 17c are disposed on the third and fourth side faces 11e, 11f. The pair of electrode portions 17c electrically connect the pair of second electrodes 15 to the pair of electrode portions 17a. The end of each electrode portion 17c on the first principal face 11a side is coupled to the electrode portion 17a. The end of each electrode portion 17c on the second principal face 11b side is coupled to the second electrode 15. In the present embodiment, the pair of electrode portions 17c are disposed across the entire areas of the third and fourth side faces. Each electrode portion 17c is of a substantially rectangular shape when viewed from the second direction D2.

In the electronic component EP1, as shown in FIGS. 4 and 5, the element body 3 of the multilayer capacitor C is separated from the interposer I. In the present embodiment, the element body 3 and the interposer I are separated in the third direction D3, at least, by a total thickness of the thickness of the electrode portion 5c and the thickness of the solder S interposed between the external electrode 5 and the first electrode 13. For this reason, the electrostrictive vibration, induced in the multilayer capacitor C is prevented from propagating directly from the second portions 32 of the element body 3 to the interposer I. This suppresses the acoustic noise.

The element body 3 of the multilayer capacitor C overlaps the pair of second electrodes 15, when viewed from the third direction D3. In the present embodiment, when viewed from the third direction 1)3, the second electrodes 15 substantially wholly overlap the element body 3 of the multilayer capacitor C. Namely, the size of the multilayer capacitor C is the size corresponding to the pair of second electrodes 15. In other words, the size of the multilayer capacitor C is the same as the size of a capacitor connected to an electronic device ED (cf. FIG. 7) without intervention of the interposer I. It is often the case that with decrease in the size of the multilayer capacitor C, the acoustic noise can be reduced, but it may result in failure in ensuring a sufficient capacitance. In the present embodiment, the size of the multilayer capacitor C is maintained. For this reason, the capacitance of the multilayer capacitor C is readily ensured at a sufficient level.

The internal electrodes 7, 9 of the muitilayer capacitor C overlap the pair of second electrodes 15 when viewed from the third direction D3. In the present embodiment, when viewed from the third direction D3, the second electrodes 15 substantially wholly overlap the internal electrodes 7, 9. In this manner the internal electrodes 7, 9 have the size enough to overlap at least the pair of second electrodes 15. For this reason, it is feasible to ensure the sufficient capacitance of the multilayer capacitor C.

When the multilayer capacitor C is applied, for example, to an output capacitor of a DC-DC converter, it can reduce ripple voltage. The ripple voltage is reduced with increase in the capacitance of the multilayer capacitor C. As the ripple voltage becomes lower, the electrostrictive vibration induced in the multilayer capacitor C is more reduced. Therefore, the increase in the capacitance of the multilayer capacitor C leads to reduction in electrostrictive vibration per se and thus to suppression of the occurrence of acoustic noise.

Figure 7:
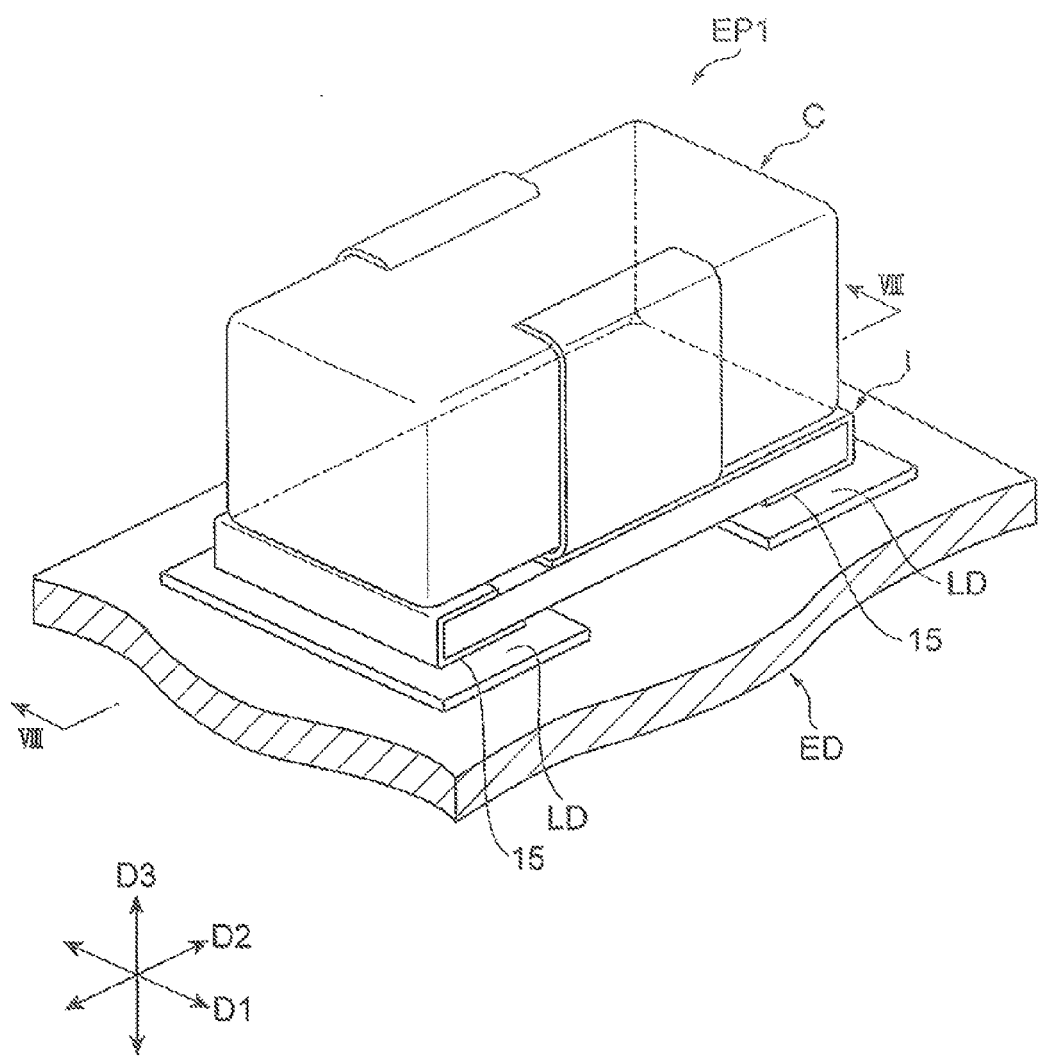
FIG. 7 is a perspective view showing a mounting example of the electronic component according to the embodiment.
Figure 8:
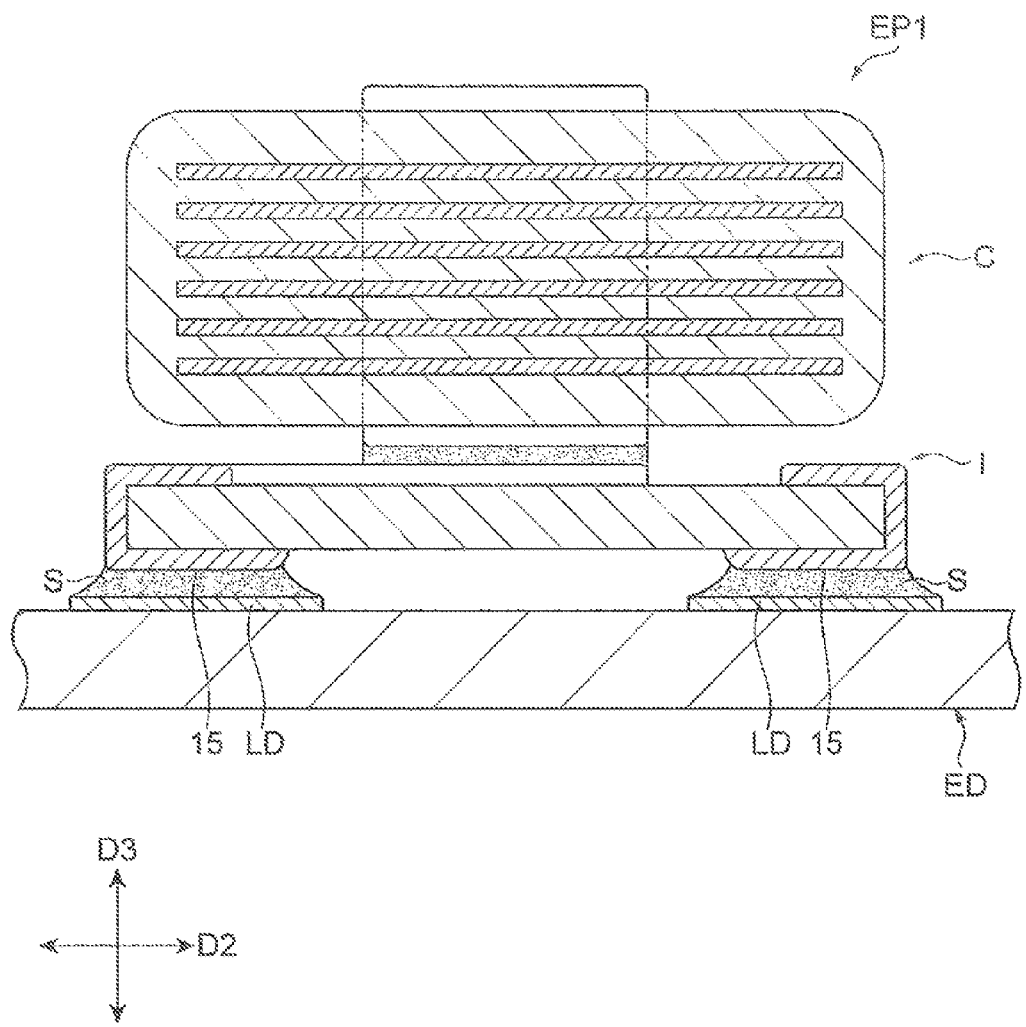
FIG. 8 is a drawing for explaining a cross-sectional configuration along the line VIII-VIII in FIG. 7.

The following will describe a mounting example of the electronic component EP1, with reference to FIGS. 7 and 8. FIG. 7 is a perspective view showing the mounting example of the electronic component according to the embodiment. FIG. 8 is a drawing for explaining the cross-sectional configuration along the line VIII-VIII in FIG. 7.

As shown in FIGS. 7 and 8, the electronic component EP1 is mounted on an electronic device ED, in the electronic component EP1, the second principal face 11b is a mount surface to the electronic device ED. In this mounting example, the electronic component EP1 is mounted on the electronic device ED with solder. Specifically, each second electrode 15 is connected to each land electrode LD provided on the electronic device ED, with solder S.

In a state in which the electronic component EP1 is mounted on the electronic device ED, the multilayer capacitor C is connected through the interposer I to the electronic device ED. For this reason, the electrostrictive vibration induced in the multilayer capacitor C is less likely to propagate to the electronic device ED, compared to the case where the multilayer capacitor C is connected directly to the electronic device ED without intervention of the interposer I, whereby the occurrence of acoustic noise is suppressed.

In the electronic component EP1 of the present embodiment, as described above, the pair of second portions 32 are separated from the interposer in the third direction D3. For this reason, the electrostrictive vibration induced in the multilayer capacitor C is prevented from propagating directly from each second portion 32 of the element body 3 to the interposer I.

The external electrodes 5 of the multilayer capacitor C are connected to the first electrodes 13 of the interposer I. The width W1 in the second direction D2 of the pair of external electrodes 5 is smaller than the width W2 in the second direction D2 of the element body 3, For this reason, the electrostrictive vibration in the first portion 31 being a part of the element body 3 propagates mainly through the external electrodes 5 and the first electrodes 13 to the substrate 11 of the interposer I. Furthermore, the width W1 in the second direction D2 of the pair of external electrodes 5 is larger than the width W3 in the second direction D2 of the second portion 32. For this reason, a posture of the multilayer capacitor C becomes stabilized on the interposer I. This makes it feasible to stably maintain the state in which the pair of second portions 32 are separated from the interposer I in the third direction D1. Therefore, this results in reducing the vibration propagating from the element body 3 to the substrate 11 of the interposer I.

As a result, the present embodiment reduces the vibration propagating from the multilayer capacitor C through the interposer I to the electronic device ED. This can fully suppress the occurrence of acoustic noise. The pair of connection electrodes 17 are not disposed on the second principal face 11b but disposed on the first principal face 11a. For this reason, in a process of mounting the electronic component EP1 with solder, the solder S is less likely to flow from the pair of second electrodes 15 onto the pair of connection electrodes 17 so as to cause unevenness of solder amounts between the pair of second electrodes 15. Therefore, it is feasible to prevent inclination of the electronic component EP1 in the mounting process.

The pair of first electrodes 13 overlap each other when viewed from the first direction D1. The distance L is equivalent to the width W1. In a process of mounting the multilayer capacitor C on the interposer I with solder, the solder S is prevented from melting and spreading over the edge of the first electrodes 13. For this reason, it is easy to match the end of the first electrode 13, disposed on the first side face 11c side, on the third side face 11e side and the end of the external electrode 5, connected thereto, on the third side face 11e side. It is easy to match the end of the first electrode 13, disposed on the second side face 11d side, on the fourth side face 11f side and the end of the external electrode 5, connected thereto, on the fourth side face 11f side. Therefore, the multilayer capacitor C is less likely to be mounted with deviation in the second direction D2 with respect to the interposer I.

The pair of external electrodes S include the pair of electrode portions 5c disposed on the third side face 3c opposed to the first principal face 11a. The width W5 in the first direction D1 of the first electrodes 13 is larger than the width W6 in the first direction D1 of the pair of electrode portions 5c. For this reason, in the process of mounting the multilayer capacitor C on the interposer I with solder, the solder S melts and flows onto the pair of first electrodes 13. As a sufficient wet spread region (escape region) for the solder S is ensured in the first direction D1 on the pair of first electrodes 13 in this manner, fixing strength is enhanced between the pair of first electrodes 13 and the pair of external electrodes 5. As a result, the multilayer capacitor C is firmly mounted on the interposer I.

The pair of second portions 32 of the element body 3 overlap the pair of second electrodes 15 when viewed from the third direction D3. For this reason, the size of the substrate 11 of the interposer I can be set to a size approximately equal to or slightly larger than the multilayer capacitor C when viewed from the third direction D3. This enables high-density mounting of the electronic component EP1.

The plurality of internal electrodes 7, 9 overlap the pair of second electrodes 15 when viewed from the third direction D3. For this reason, the size of each internal, electrode 7 or 9 can be set larger in comparison with the case where the plurality of internal electrodes 7, 9 do not overlap the pair of second electrodes 15 when viewed from the third direction D3. The capacitance of the multilayer capacitor C becomes larger with increase in size of the internal electrodes 7, 9, supposing the gaps between adjacent internal electrodes 7, 9 in the stack direction are equal. Therefore, it becomes feasible to achieve increase in capacitance of the multilayer capacitor C.

The pair of external electrodes 5 include the pair of electrode portions 5a disposed on the pair of first side faces 3a. The solder S melts and flows up onto the electrode portions 5a. Namely the electrode, portions 5a are connected to the first electrodes 13 with the solder S. This increases the regions where the external electrodes 5 and the first electrodes 13 are connected by the solder S. This makes the multilayer capacitor C firmly mounted to the interposer I.

Table 1 below shows the result of measurement to measure the fixing strength of the multilayer capacitor C with variation in ratio of rise of the solder S (rise height ratio of the solder 5) to height of the multilayer capacitor C. The measurement herein was conducted using the multilayer capacitors C of 1005 type products with the element body 3 having the longitudinal length (width in the second direction D2) of 910 μm, the width (width in the first direction D1) of 456 μm, and the height (width in the third direction D3) of 460 nm. The fixing strength was measured by pressing either one of the pair of first side faces 3a of the multilayer capacitor C fixed on the interposer I and measuring the strength at a moment when the multilayer capacitor C was detached from the interposer I. According to this measurement result, the fixing strength can be enhanced by increase of the ratio of rise. In order to keep the fixing strength not less than 6 N, the ratio of rise may be determined to be not less than one half.

TABLE 1

| Ratio of rise (height) of solder to height of multilayer capacitor | Fixing strength (N) |
| --- | --- |
| 1/8 | 1 |
| 1/4 | 2 |
| 1/2 | 6 |
| 2/3 | 7 |
| 3/4 | 7 |

The below will describe the configuration of the electronic component, according to Modification Example 1, with reference to FIGS. 9A and 9B.

FIGS. 9A and 9B are drawings for explaining the electronic component according to Modification Example 1. Specifically, FIG. 9A is a to plan view showing, the interposer of the electronic component according to Modification Example 1. FIG. 9B is a side view from the first direction of the electronic component according to Modification Example 1.

As shown in FIG. 9A and FIG. 9B, the electronic component EP2 or Modification Example 1 is different in the shape of the first electrodes 13 of the interposer I from the electronic component EP1 of the above embodiment. In the present modification example, each of the first electrodes 13 includes electrode portions 13a, 13b. The electrode portions 13a, 13b are separated from each other in the second direction D2. Each electrode portion 13a is coupled to the electrode portion 17b to be integrated therewith. In this modification example, each of the electrode portions 13a, 13b is of the same shape, specifically a rectangular shape, when viewed from the third direction D3.

In the case of the electronic component EP1 of the embodiment, when the multilayer capacitor C is mounted on the interposer I, a piece of solder S is placed on each of the pair of first electrodes 13. It results in supporting the multilayer capacitor C at two points by solder S. For this reason, the multilayer capacitor C tends to be mounted in an inclined state.

In contrast to it, the electronic component EP2 of Modification Example 1 is configured in such a manner that when the multilayer capacitor C is mounted on the interposer I, each of the external electrodes 5 of the multilayer capacitor C is connected to the solder S disposed on each of the electrode portions 13a, 13b. Namely, the multilayer capacitor C becomes supported at four points. Since the number of connection points with the solder S increases, the posture of the multilayer capacitor C becomes stabilized on the interposer I. This makes the multilayer capacitor C unlikely to be mounted in the inclined state. Therefore, the second portions 32 of the element body 3 are prevented from coming into contact with the interposer and the occurrence of acoustic noise is surely suppressed.

The present modification example is configured in such a manner that each of die first electrodes 13 includes the electrode portions 13a, 13b, but the multilayer capacitor may also be configured in such a manner that only either one of the first electrodes 13 includes the electrode portions 13a, 13b.

Figure 10A:
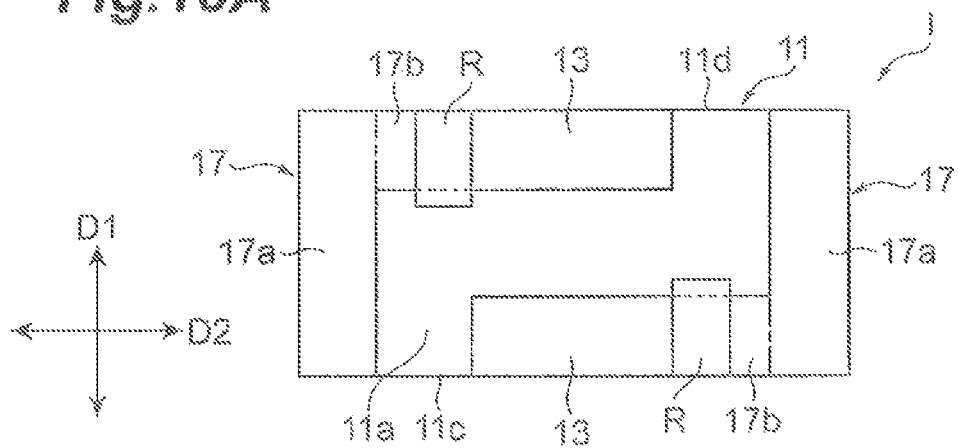
FIGS. 10A to 10C are drawings for explaining electronic components according to Modification Examples 2 to 4.

The configuration of the electronic component according to Modification Example 2 will be described below with reference to FIG. 10A. FIG. 10A is a top plan view showing the interposer of the electronic component according to Modification Example 2.

As shown in FIG. 10, the electronic component according to Modification Example 2 is different from the electronic component EP1 of the embodiment in that solder resists R are provided on the electrode portions 17b in the connection electrodes 17 of the interposer I. In the present modification example, each solder resist R covers the entire length in the first direction D1 of the electrode portion 17b in a region of the electrode portion 17b adjacent to the electrode portion 17a. The solder resists R are made of a thermosetting epoxy resin paint using a metal oxide pigment, for example. The solder resists R can be formed on the electrode portions 17b by a well-known dispensing method (e.g., application by a dispenser or a screen printing method).

In the present modification example, since the solder resists R are provided on the respective connection electrodes 17 and in the vicinity of the first electrodes 13, the solder S on the first electrodes 13 is prevented from flowing onto the connection electrodes 17. For this reason, unevenness of solder amounts is less likely to occur between the first electrodes 13. This stabilizes the posture of the multilayer capacitor C on the interposer I. For this reason, the multilayer capacitor C is unlikely to be mounted in the inclined state. Therefore, the second portions 32 of the element body 3 are prevented from coming into contact with the interposer I, whereby the occurrence of acoustic noise is surely suppressed.

The solder resists R need only to be provided on the electrode portions 11b but do not always have to cover the whole of the electrode portions 17b. When the distance in the second direction D2 between the first electrode 13 disposed on the first side face 11c side and the solder resist R is set equivalent, to the distance in the second direction D2 between the first electrode 13 disposed on the second side face 11d side and the solder resist R, it becomes easier to restrain unevenness of solder amounts. When a respective amount and range of the solder resist R provided on the first side face 11c side is set equivalent to that on the second side face 11d side, it becomes much easier to restrain the unevenness of solder amounts.

Figure 10B:
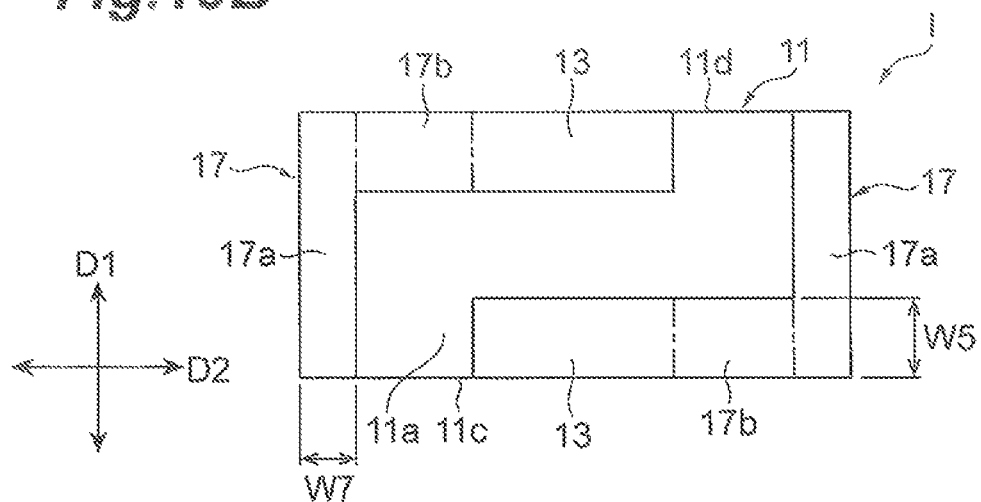

The configuration of the electronic component according to Modification Example 3 will be described below with reference to FIG. 10B. FIG. 10B is a top plan view showing the interposer of the electronic component according to Modification Example 3.

As shown in FIG. 10B, the electronic component according to Modification Example 3 is different in the shape of the connection electrodes 17 of the interposer I from the electronic component EP1 of the embodiment. In the present modification example, the width W7 in the second direction of each electrode portion 17a is smaller than the width W5 in the first direction D1 of each first electrode 13. The width W7 may be not more than one tenth or may be not more than one twentieth of the width in the second direction D2 of the substrate 11.

In the present modification example, the area of each electrode portion 17a on the first principal face 11a is smaller than the area in the case where the width W7 is equivalent to the width W5. For this reason, in the process of mounting the electronic component on the electronic device with solder, the solder is prevented from flowing up onto the first principal face 11a side of the substrate 11. Namely, even if the solder flows from the second electrodes 15 (cf. FIG. 2) via the electrode portions 17c (cf. FIG. 1) to each the first principal face 11a side, reaching amounts thereof will be restricted, because of the small area of the electrode portions 17a coupled to the electrode portions 17c and disposed on the first principal face 11a of the substrate 11. This can prevent the element body 3 of the multilayer capacitor C from being directly connected through the solder to the substrate 11 of the interposer I.

Figure 10C:
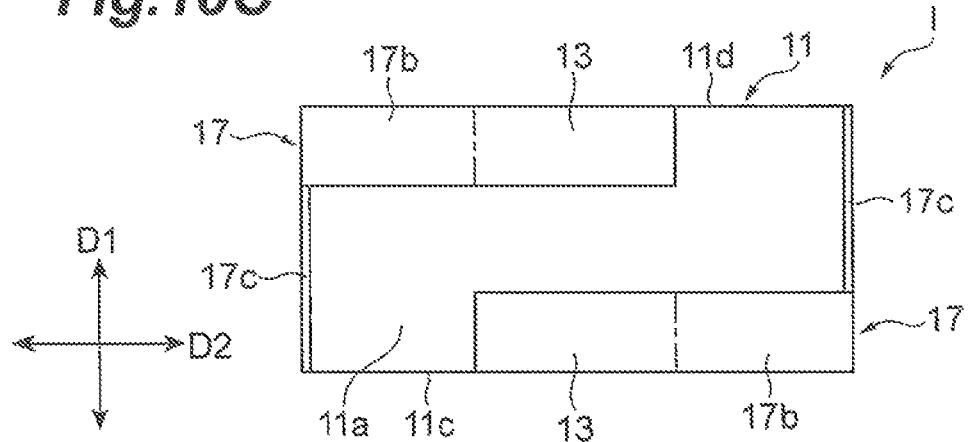

The configuration of the electronic component according to Modification Example 4 will be described below with reference to FIG. 10C. FIG. 10C is a top plan view showing the interposer of the electronic component according to Modification Example 4.

As shown in FIG. 10C, the electronic component according to Modification Example 4 is different in the shape of the connection electrodes 17 of the interposer I from the electronic component EP1 of the embodiment. In the present modification example, the connection electrodes 17 are configured without the electrode portions 17a (cf. FIG. 3). Each electrode portion 17b extends in the second direction D2 to directly connect the first electrode 13 to the electrode portion 17c.

In the present modification example, in the process of mounting the electronic component on the electronic device with solder, the solder is prevented from flowing up onto the first principal face 11a side of the substrate 11. Namely, even if the solder flows from the second electrodes 15 (cf. FIG. 2) via the electrode portions 17c to reach the first principal face 11a side, reaching amounts thereof will be restricted because the electrode portions 17a extending in the first direction D1 are not disposed on the third and fourth side face 11e, 11f sides of the first principal face 11a of the substrate 11. This can prevent, the element body 3 of the multilayer capacitor C from being directly connected through the solder to the substrate 11 of the interposer I.

The configuration of the electronic component according to Modification Example 5 will be described below with reference to FIGS. 11A and 11B. FIG. 11A is a perspective view showing the interposer of the electronic component according to Modification Example 5. FIG. 11B is a bottom plan view showing the interposer of the electronic component according to Modification Example 5.

As shown in FIGS. 11A and 11B, the electronic component according to Modification Example 5 is different in the shapes of the substrate 11, the connection electrodes 17, and the second electrodes 15 of the interposer I from the electronic component EP1 of the embodiment. In the present modification example, each of the third and Fourth side faces 11e, 11f is provided with a groove G of a cutout shape in the center in the first direction D1. The groove G is continuous from the first principal face 11a to the second principal face 11b.

The groove S includes a curved surface normal to the first and second principal faces 11a, 11b. The groove G is of a semicircular shape when viewed from the third direction D3. Inside the groove G, the electrode portion 17c is provided in substantially uniform thickness along the curved surface. The portions of the third and fourth side faces 11e, 11f other than the grooves S are exposed from the electrode portions 17c.

Each second electrode 15 includes electrode portions 15a, 15b, The electrode portions 15a, 15b are located apart in the first direction D1 by the groove G. Namely, the electrode portions 15a, 15b are separated from each other in the first direction D1. The electrode portion 15a is disposed on the first side face 11c side. The electrode portion 15b is disposed on the second side face 11d side. Each of the electrode portions 15a, 15b is of a rectangular shape when viewed from the third direction D3.

In this example, each second electrode 15 further includes an electrode portion 15c. The electrode portion 15c connects the electrode portions 15a, 15b to each other. Widths in the second direction D2 of the electrode portion 15c are smaller than a width in the second direction D2 of the electrode portions 15a, 15b. Namely, the second electrode 15 is concave in the second direction D2 in the electrode portion 15c. The width of the electrode portion 15c in the second direction D2 varies continuously.

In the present modification example, the electrode portion 15c is narrower in width in the second direction D1. For this reason, in the process of mounting the electronic component on the electronic device through the second electrodes 15 with solder, a piece of solder provided on each electrode portion 15a and a piece of solder provided on each electrode portion 15b are less likely to move through the electrode portion 15c. Therefore, the electronic component is mounted on the electronic device , pieces of solder provided on the electrode portions 15a and pieces of solder provided on the electrode portions 15b. This increases the number of connection points by the solder, which stabilizes the posture of the electronic component For this reason, the electronic component is unlikely to be mounted in the inclined state.

The width of the narrowest region in the second direction D2 of the electrode portion 15c may be set to be not more than two thirds of the width in the second direction D2 of the electrode portions 15a, 15b.

The groove G may be provided in only either one of the third and fourth side faces 11e, 11f. Each second electrode 15 may be completely divided by the groove in this case, the electrode portion 15c may be divided into an electrode portion coupled to the electrode portion 15a and an electrode portion coupled to the electrode portion 15b. The second electrode 15 may be configured without the electrode portion 15c. The groove G may be one having a plurality of planes normal to the first and second principal faces 11a, 11b and may be one of either of a triangular shape and a rectangular shape, for example, when viewed, from the third direction D3.

The electrode portion 17c does not always have to be provided in the groove G. the electrode portion 17c may be provided on a portion other than the groove G. Solder melts and spreads on metal. For this reason, in the present modification example, the solder tends to concentrate more in the groove G provided with the electrode portion 17c than on the portions without the electrode portion 17c other than the groove G. Therefore, in the process of mounting the electronic component on the electronic device with solder, excess solder is allowed to escape into a vacant region in the groove G. Namely, the vacant region in the groove G functions as an escape region for solder. This further enhances the stability of the posture of the multilayer capacitor C on the interposer I.

Next, the configuration of the electronic, component according to Modification Example 6 will be described below with reference to FIG. 11C. FIG. 11C is a bottom plan view showing the interposer of the electronic component according to Modification Example 6.

As shown in FIG. 11C, the electronic component according to Modification Example 6 is different in the shape of the second electrodes 15 of the interposer I from the electronic component EP1 of the embodiment. In the present modification example, each second electrode 15 includes the electrode portions 15a, 15b. The electrode portions 15a, 15b are separated from each other in the first direction D1 The electrode portion 15a is disposed on the first side face 11c side. The electrode portion 15b is disposed on the second side face 11d side. Each of the electrode portions 15a, 15b is of a rectangular shape when viewed from the third direction D3.

In this example, the second electrode 15 further includes the electrode portion 15c. The electrode portion 15c connects the electrode portions 15a, 15b to each other. The width in the second direction D2 of the electrode portion 15c is smaller than the width in the second direction D2 of the electrode portions 15a, 15b. The second electrode 15 is concave in the second direction D2 in the electrode portion 15c.

In the present modification example, the electrode portion 15c is narrower in width in the second direction D2. For this reason, in the process of mounting the electronic component on the electronic device through the second electrodes 15 with solder, a piece of solder provided on each electrode portion 15a and a piece of solder provided on each electrode portion 15b are less likely to move through the electrode portion 15c. Therefore, the electronic component is mounted on the electronic device by pieces of solder provided on the electrode portions 15a and pieces of solder provided on the electrode portions 15b. This increases the number of connection points by the solder, which stabilizes the posture of the electronic component. For this reason, the electronic component is unlikely to be mounted in the inclined state. The width of the narrowest legion in the second direction D2 of the electrode portion 15c may be set to be not more than two thirds of the width in the second direction D2 of the electrode portions 15a, 15b.

Each second electrode 15 may be configured without the electrode portion 15c. It is also possible to adopt a configuration wherein only one of the second electrodes 15 includes the electrode portions 15a, 15b.

The above described the embodiment of the present invention but it should be noted that the present invention does not always have to be limbed to the above-described embodiment and that the present invention can be modified in many ways without departing from the spirit and scope of the invention. The shapes of the first electrodes 13, the second electrodes 15, and the connection electrodes 17 do not have to be limited only to the shapes in the above-described embodiment and Modification Examples 1 to 6. For example, the first electrodes 13 do not have to be limited to the rectangular shape but may be of a trapezoid shape or a semicircular shape.

The connection electrodes 17 need only to be disposed on the faces other than the second principal face 11b and, for example, the electrode portions 17c may be disposed on the first and second side faces 11c, 11d. The width in the first direction D1 of the electrode portions 17b may be smaller than the width W5 in the first direction D1 of the first electrode 13. Transfer of vibration can be made less by reducing the width in the first direction Di of the electrode pardons 17b.

What is claimed is:

1. An electronic component comprising: a multilayer capacitor; and an interposer on which the multilayer capacitor is mounted,
    wherein the multilayer capacitor comprises:
    a multilayer body of a substantially rectangular parallelepiped shape in which a plurality of dielectric layers and a plurality of internal electrodes are stacked; and
    a pair of external electrodes disposed on ends in a first direction in the multilayer body and each connected to a corresponding internal electrode of the plurality of internal electrodes,
    wherein the interposer comprises:
    a substrate including a first principal face of a planar shape opposed to the multilayer capacitor, a second principal face of a planar shape opposed to the first principal face, first and second side faces of a planar shape opposed to each other in the first direction, and third and fourth side faces of a planar shape opposed to each other in a second direction perpendicular to both the first direction and a direction in which the first and second principal faces are opposed;
    a pair of first electrodes disposed on the first and second side face sides of the first principal face and each connected to a corresponding external electrode of the pair of external electrodes;
    a pair of second electrodes disposed on the third and fourth side face sides of the second principal face; and
    a pair of connection electrodes disposed on the first principal face and each electrically connected to the first electrode and the second electrode,
    wherein the multilayer body, when viewed from the first direction, includes a first portion covered by the external electrode, and a pair of second portions located on both sides of the first portion and exposed from the external electrode,
    wherein, the pair of second portions of the multilayer body are separated from the interposer, and
    wherein a width in the second direction of the pair of external electrodes is smaller than a width in the second direction of the multilayer body and larger than a width in the second direction of the second portion.

2. The electronic component according to claim 1,
    wherein the pair of connection electrodes include a pair of first electrode portions disposed on the third and fourth side face sides of the first principal face and extending in the first direction, and
    wherein a width in the first direction of each of the first electrodes is smaller than a width in the first direction of each of the first electrode portions and larger than a width in the second direction of each of the first electrode portions.

3. The electronic component according to claim 1,
    wherein each of the pair of first electrodes includes two electrode portions separated from each other in the second direction.

4. The electronic component according to claim 1,
    wherein each of the connection electrodes is coupled to the first electrode, and
    wherein a solder resist is provided on each of the connection electrodes and in the vicinity of the first electrode.

5. The electronic component according to claim 1,
    wherein the pair of first electrodes overlap each other when viewed from the first direction, and
    wherein a distance in the second direction between an end of the first electrode, disposed on the first side face side, on the third, side face side and an end of the first electrode, disposed on the second side face side, on the fourth site face side is equivalent to the width in the second direction of the pair of external electrodes.

6. The electronic component according to claim 1,
    wherein, the pair of external electrodes include a pair of electrode portions disposed on a face opposed to the first principal thee in the multilayer body, and
    wherein a width in the first direction of the first electrode is larger than a width in the first direction of the pair of electrode portions disposed on the face opposed to the first principal face in the multilayer body.

7. The electronic component according to claim 1,
    wherein the pair of external electrodes include a pair of electrode portions disposed on a pair of faces opposed in the first direction in the multilayer body, and
    wherein the electrode portion disposed on each of the faces opposed in the first direction in the multilayer body is connected to the first electrode with solder.

8. The electronic component according to claim 1,
    wherein each of the third and fourth side faces is provided with a groove continuous from the first principal face to the second principal face in a center in the first direction.

9. The electronic component according to claim 1,
    wherein each of the pair of second electrodes includes two electrode portions separated from each other in the first direction.

* * * * *